US010290624B2

(12) United States Patent
Yao et al.

(10) Patent No.: US 10,290,624 B2
(45) Date of Patent: May 14, 2019

(54) ESD PROTECTION DEVICE AND METHOD FOR MANUFACTURING THE SAME

(71) Applicant: Silergy Semiconductor Technology (Hangzhou) Ltd., Hangzhou (CN)

(72) Inventors: Fei Yao, Hangzhou (CN); Shijun Wang, Hangzhou (CN); Dengping Yin, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 15/730,419

(22) Filed: Oct. 11, 2017

(65) Prior Publication Data
US 2018/0102355 A1    Apr. 12, 2018

(30) Foreign Application Priority Data
Oct. 12, 2016   (CN) .......................... 2016 1 0891006

(51) Int. Cl.
*H01L 27/02*   (2006.01)
*H01L 29/66*   (2006.01)
*H01L 29/861*   (2006.01)
*H01L 29/06*   (2006.01)

(52) U.S. Cl.
CPC ...... *H01L 27/0248* (2013.01); *H01L 27/0255* (2013.01); *H01L 29/0692* (2013.01); *H01L 29/66007* (2013.01); *H01L 29/861* (2013.01)

(58) Field of Classification Search
CPC ........... H01L 27/0248; H01L 29/66007; H01L 2224/752; H05K 1/0259; H05K 9/0079; H01R 13/6485
See application file for complete search history.

(56) References Cited

U.S. PATENT DOCUMENTS

| 2008/0079073 | A1* | 4/2008 | Akai | H01L 29/0878 257/339 |
| 2012/0119331 | A1* | 5/2012 | Gendron | H01L 27/0262 257/587 |
| 2012/0133025 | A1* | 5/2012 | Clarke | H01L 27/0259 257/570 |
| 2013/0075866 | A1* | 3/2013 | Otake | H01L 27/0259 257/577 |
| 2017/0077082 | A1* | 3/2017 | Marreiro | H01L 27/0262 |

FOREIGN PATENT DOCUMENTS

CN          105789332 A       7/2016

* cited by examiner

*Primary Examiner* — Yosef Gebreyesus
(74) *Attorney, Agent, or Firm* — Westman, Champlin & Koehler, P.A.

(57) ABSTRACT

Disclosed is an ESD protection device, comprising: a semiconductor substrate; a semiconductor buried layer located in the semiconductor substrate; an epitaxial semiconductor layer located on the semiconductor substrate and comprising a first doped region and a second doped region, wherein the semiconductor substrate and the first doped region are of a first doping type, the semiconductor buried layer, the epitaxial semiconductor layer and the second doped region are of a second doping type, the first doping type and the second doping type are opposite to each other, and the first doped region forms a plurality of interfaces with the epitaxial semiconductor layer. The disclosure improves protection performance and maximum current bearing capacity without increasing parasitic capacitance of the ESD protection device.

6 Claims, 7 Drawing Sheets

ESD PROTECTION DEVICE AND METHOD FOR MANUFACTURING THE SAME

CROSS-REFERENCE TO RELATED APPLICATION

This application claims the benefit of Chinese Patent Application No. 201610891006.1, filed on Oct. 12, 2016, which is incorporated herein by reference in its entirety.

BACKGROUND OF THE DISCLOSURE

Field of the Disclosure

The present disclosure relates to a semiconductor device and a method for manufacturing the same, and in particular, to an ESD protection device and a method for manufacturing the same.

Background of the Disclosure

Electrostatic discharge (ESD) is a phenomenon that charges are released and transferred between integrated circuit chips and external objects. Due to a large quantity of charges being released in a short time, the ESD energy is much higher than the bearing capacity of the chips, which may cause temporary function failure or even permanent damage to the chips. During the process for manufacturing a chip, a bracelet or an anti-static clothing can be used to reduce the damage of ESD. After the chip is fabricated, it is easily affected by the electrostatic discharge between the chip and the external objects when it is used in various environments. An ESD protection device is provided in the chip to offer an electrostatic discharge path for effectively protecting the chip, so that the reliability and service life of the integrated circuit chip is improved.

In modern electronic products such as smartphones, laptops, tablets and LED displays, ESD protection devices are widely used for providing protection to high-speed data ports such as HDMI, USB, DVI, etc., mounted on printed circuit boards (PCBs). These ESD protection devices are either discrete devices or integrated into the chip. For protecting the high-speed data ports, the ESD protection devices are required to have great protection capability as well as low parasitic capacitance (for example, less than 0.5 pF).

The ESD protection device can be implemented based on various circuit structures. FIG. 1 is a longitudinal cross-sectional structural diagram of an ESD protection device, and FIG. 2 is an equivalent circuit diagram of the ESD protection device shown in FIG. 1. As shown in FIG. 2, the ESD protection device includes a Zener diode (or an avalanche diode) DZ being coupled between a power supply terminal VCC and the ground GND, and further includes a rectification diode D1 and a rectification diode D2 coupled in series between the power supply terminal VCC and the ground GND, and an input/output terminal I/O is led at an intermediate node of the rectification diodes D1 and D2. The input/output terminal I/O is, for example, a terminal of a high-speed data port. Corresponding to FIG. 2, a first doped region 107 and an epitaxial semiconductor layer 103 in FIG. 1 constitute the rectification diode D1 in FIG. 2, a second doped region 108, the epitaxial semiconductor layer 103 and a semiconductor substrate 101 constitute the rectification diode D2 in FIG. 2, and the semiconductor substrate 101 and a semiconductor buried layer 102 constitute the Zener diode (or the avalanche diode) DZ in FIG. 2.

When positive ESD or surge occurs near the input/output terminal I/O, the rectification diode D1 is turned on at forward direction, the Zener diode (or avalanche diode) DZ is under reverse breakdown condition. As shown in FIG. 1, an ESD current at the input/output terminal I/O flows through the rectification diode D1 and the Zener diode (or avalanche diode) DZ to the ground GND. Due to the accumulated effect of the current and parasitic capacitance effect of the epitaxial semiconductor layer 103, most of the ESD current will converge in the semiconductor buried layer 102 directly below the first doped region 107, and thus, when the ESD current becomes large, the semiconductor buried layer 102 directly below the first doped region 107, due to the accumulated effects of the ESD current, may be first punctured and eventually cause the Zener diode (or avalanche diode) DZ to fail. FIG. 3 is a top diagram of the ESD protection device shown in FIG. 1. The dashed region in FIG. 3, represents an effective region 109 of the Zener diode (or avalanche diode) DZ, that is, the portion of the semiconductor buried layer 102 directly below the first doped region 107. The region plays a major role in ESD protection performance and anti-surge performance. However, the parasitic capacitance of the ESD protection device is relevant to the area of the first doped region 107, that means, an increase of the area of the doped region 107 will lead to an increase of the parasitic capacitance of the ESD protection device.

Therefore, it is desired that the ESD protection performance and maximum current bearing capacity can be improved without increasing the area of the first doped region.

SUMMARY OF THE DISCLOSURE

The technical problem to be solved in the disclosure is to provide an ESD protection device and a method for manufacturing the same, which can solve the problem that the effective region of the Zener diode (or avalanche diode) DZ in the ESD protection device is easily damaged, thereby causing the degradation of the ESD protection performance and anti-surge performance of the ESD protection device.

To solve the above technical problem, according to a first aspect of the disclosure, there is provided an ESD protection device, comprising: a semiconductor substrate; a semiconductor buried layer located in the semiconductor substrate; an epitaxial semiconductor layer located on the semiconductor substrate and comprising a first doped region and a second doped region, wherein the semiconductor substrate and the first doped region are of a first doping type, the semiconductor buried layer, the epitaxial semiconductor layer and the second doped region are of a second doping type, the first doping type and the second doping type are opposite to each other, and the first doped region forms a plurality of interfaces with the epitaxial semiconductor layer.

Preferably, the first doped region comprises a plurality of sub-regions which are respectively formed in the epitaxial semiconductor layer, and the plurality of sub-regions form the respective interfaces with the epitaxial semiconductor layer, respectively.

Preferably, the plurality of sub-regions are circular, square, or rectangular.

Preferably, the first doped region is an annular region being formed in the epitaxial semiconductor layer, and the annular region comprises an inner surface and an outer surface, the inner surface and the outer surface form the interfaces with the epitaxial semiconductor layer, respectively.

Preferably, the annular region is circular, square, or rectangular.

Preferably, the ESD protection device further comprises a first terminal, wherein the first doped region and the second doped region are connected to each other to the first terminal.

Preferably, the ESD protection device further comprises a third doped region which penetrates through the epitaxial semiconductor layer to the semiconductor buried layer and the third doped region is of the second doping type.

Preferably, the ESD protection device further comprises a second terminal being connected to the third doped region.

Preferably, the ESD protection device further comprises an isolation layer being formed between the first doped region and the second doped region in the epitaxial semiconductor layer.

According to a second aspect of the disclosure, there is provided a method for manufacturing an ESD protection device, comprising: forming a doped region at a specific position of a surface of a semiconductor substrate, and then forming an epitaxial semiconductor layer on the surface of the semiconductor substrate by epitaxial growth, wherein the epitaxial semiconductor layer covers the doped region to form a semiconductor buried layer;

forming a first doped region and a second doped region in the epitaxial semiconductor layer; and forming a first terminal, wherein the first doped region and the second doped region are connected to each other to the first terminal, the semiconductor substrate and the first doped region are respectively of a first doping type, the semiconductor buried layer, the epitaxial semiconductor layer and the second doped region are respectively of a second doping type, the first doping type and the second doping type are opposite, and the first doped region forms a plurality of interfaces with the epitaxial semiconductor layer.

Preferably, the first doped region comprises a plurality of sub-regions which are respectively formed in the epitaxial semiconductor layer, and the plurality of sub-regions forms the respective interfaces with the epitaxial semiconductor layer, respectively.

Preferably, the plurality of sub-regions are circular, square, or rectangular.

Preferably, the first doped region is an annular region being formed in the epitaxial semiconductor layer, and the annular region comprises an inner surface and an outer surface, and the inner surface and the outer surface form the interfaces with the epitaxial semiconductor layer, respectively.

Preferably, the annular region is circular, square, or rectangular.

Preferably, the method further comprises: forming a third doped region in the epitaxial semiconductor layer, which penetrates through the epitaxial semiconductor layer to the semiconductor buried layer, and the third doped region is of the second doping type Preferably, the method further comprises: forming a second terminal being connected to the third doped region.

Preferably, the method further comprises: forming an isolation layer between the first doped region and the second doped region in the epitaxial semiconductor layer.

With the technical scheme of the present disclosure, the following advantageous effects can be obtained.

Due to the changed arrangement manner of the first doped region, the area of the effective region of the Zener diode (or avalanche diode) DZ has been increased. As a result, when the ESD current becomes large, the effective region of the Zener diode (or avalanche diode) DZ won't be damaged quickly due to the accumulated effect of the ESD current, so that the ESD protection performance and the maximum current bearing capacity are improved.

BRIEF DESCRIPTION OF THE DRAWINGS

The above and other objects, advantages and features of the present invention will become more fully understood from the detailed description given hereinbelow in connection with the appended drawings, and wherein.

DETAILED DESCRIPTION OF THE DISCLOSURE

Figure 1:
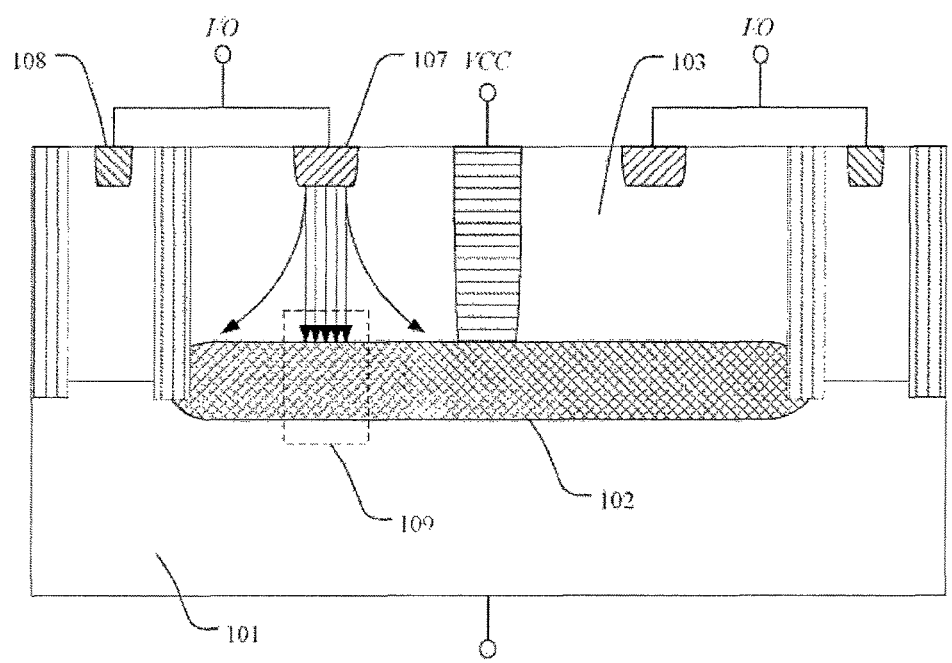
FIG. 1 is a longitudinal cross-sectional diagram of an ESD protection device.
Figure 2:
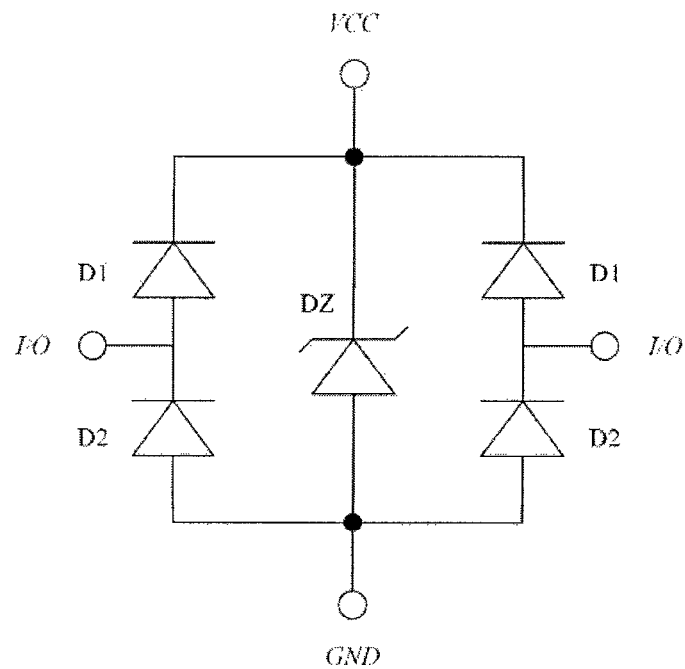
FIG. 2 is an equivalent circuit diagram of the ESD protection device shown in FIG. 1.
Figure 3:
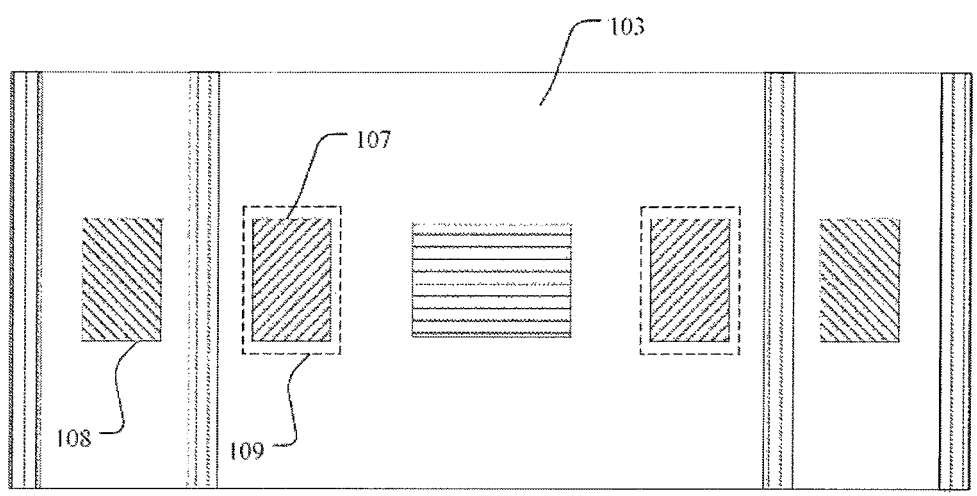
FIG. 3 is a top diagram of the ESD protection device shown in FIG. 1.

Reference will now be made in detail to particular embodiments of the disclosure, it will be understood that the scope of the present invention is not limited to these embodiments. Furthermore, in the following detailed description of the present disclosure, numerous specific details are set forth. However, it will be readily apparent to one skilled in the art that the present disclosure may be practiced without these specific details. In other instances, well-known methods, procedures, processes have not been described in detail so as not to unnecessarily obscure aspects of the present invention.

In the drawings, like reference numerals denote like members. The figures are not drawn to scale, for the sake of clarity. Moreover, some well-known parts may not be shown in figures. The flow and block diagrams in the drawings illustrate the system, method, the possible architectural framework, functions and operations of the apparatus, according to the embodiments of the present disclosure, the boxes and box order are only used for better illustrating the procedure and steps of the embodiments, and should not be used for limiting the invention itself.

Exemplary embodiments of the present disclosure will be described in more details below with reference to the accompanying drawings. In the drawings, like reference numerals denote like members. The figures are not drawn to scale, for the sake of clarity. Moreover, some well-known parts may not be shown. For simplicity, the structure of the semiconductor device having been subject to several relevant process steps may be shown in one figure.

It should be understood that when one layer or region is referred to as being "above" or "on" another layer or region in the description of device structure, it can be directly above or on the other layer or region, or other layers or regions may be intervened therebetween. Moreover, if the device in the figures is turned over, the layer or region will be under or below the other layer or region.

In contrast, when one layer is referred to as being "directly on" or "on and adjacent to" or "adjoin" another layer or region, there are not intervening layers or regions present. In the present application, when one region is referred to as being "directly in", it can be directly in another region and adjoins the another region, but not in a implantation region of the another region.

In the present application, the term "semiconductor structure" generally means the whole semiconductor structure formed at each step of the method for manufacturing the semiconductor device, including all of the layers and regions having been formed.

Some particular details of the present disclosure will be described below, such as exemplary semiconductor structures, materials, dimensions, process steps and technologies of the semiconductor device, for better understanding of the present disclosure. However, it can be understood by one skilled person in the art that these details are not always essential for but can be varied in a specific implementation of the disclosure.

Figure 4A:
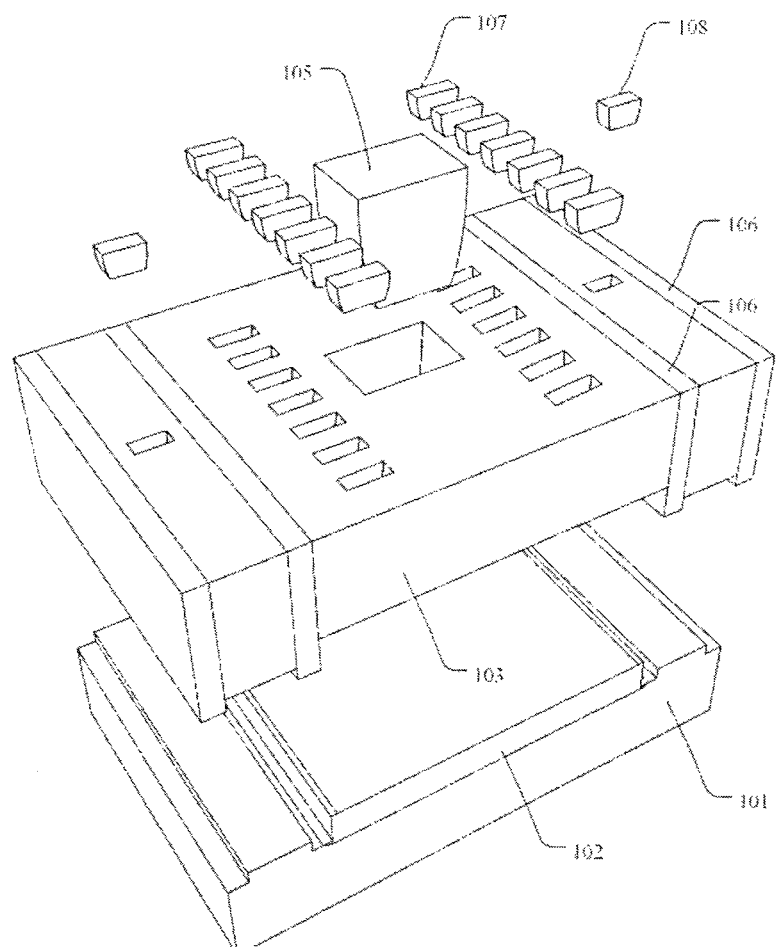
FIGS. 4a and 4b are a perspective decomposition diagram and a top diagram of an ESD protection device according to a first embodiment of the disclosure, respectively.
Figure 4B:
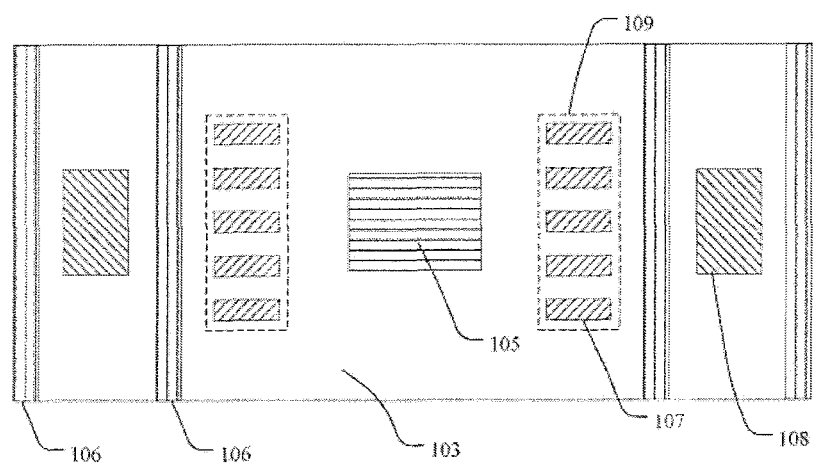

In a first embodiment, there is provided an ESD protection device, the structure of the ESD protection device can refer to FIGS. 4a and 4b. FIGS. 4a and 4b shows a perspective decomposition diagram and a top diagram of the ESD protection device according the first embodiment of the disclosure, respectively.

As shown in FIGS. 4a and 4b, the ESD protection device includes a semiconductor substrate 101, a semiconductor buried layer 102 located in the semiconductor substrate 101, an epitaxial semiconductor layer 103 on the semiconductor substrate 101, and a first doped region 107 and a second doped region 108 in the epitaxial semiconductor layer 103.

The ESD protection device according to the first embodiment further comprises a third doped region 105 which penetrates through the epitaxial semiconductor layer 103 to the semiconductor buried layer 102.

For example, the semiconductor substrate 101 and the first doped region 107 are of P-type, respectively, and the semiconductor buried layer 102, the epitaxial semiconductor layer 103, the second doped region 108 and the third doped region 105 are of N-type, respectively.

In the embodiment, the first doped region 107 includes a plurality of sub-regions being formed in the epitaxial semiconductor layer 103, the plurality of sub-regions forms respective interfaces with the epitaxial semiconductor layer 103, the sub-regions are rectangular, the sub-regions are arranged in column and formed at both sides of the third doped region 105.

The interfaces are semiconductor interfaces, a semiconductor interface refers to a surface through which semiconductor contacts with other substances, and other substances include metal, insulating medium and semiconductor. In the embodiment, the interfaces are referred to the contact surface between semiconductor and semiconductor.

Preferably, in the ESD protection device according to the first embodiment, an isolation layer 106 is provided between the first doped region 107 and the second doped region 108 in the epitaxial semiconductor layer 103, and is set at edge position of the epitaxial semiconductor layer 103 wherein the edge position is adjacent to the second doped region 108, the isolation layer 106 for example is a trench filled with insulating materials (for example oxide), or a diffused isolation region of a same doping type with that of the first doped region 107.

In the ESD protection device, the semiconductor substrate 101 and the semiconductor buried layer 102 constitute DZ, DZ is for example a Zener diode or an avalanche diode, the first doped region 107 and the epitaxial semiconductor layer constitute the rectification diode D1, the second doped region 108, the epitaxial semiconductor layer 103 and the semiconductor substrate 101 constitute the rectification diode D2. The semiconductor substrate 101 and the first doped region 107 are used as an anode, and the second doped region 108 is used as a cathode.

The ESD protection device further includes a first terminal, the first terminal is an input/output terminal I/O, the first doped region 107 and the second doped region 108 are coupled to each other to the input/output terminal I/O and the semiconductor substrate 101 is used as the ground GND.

Preferably, the ESD protection device according to the first embodiment, further includes a second terminal which is a power supply terminal VCC, and the third doped region 105 is coupled to the power supply terminal VCC.

When positive ESD or surge occurs near the input/output terminal I/O, D1 is turned on at forward direction and DZ is under reverse breakdown condition, the ESD protection device is turned on, thereby providing an electrostatic discharge path.

High-speed data transfer device requires the ESD protection device with very low parasitic capacitance, for example less than 0.5 pF, and the parasitic capacitance of the ESD protection device is relevant to the area of the first doped region 107, so that, in order not to increase the parasitic capacitance of the ESD protection device, the first doped region 107 in the ESD protection device according to the first embodiment has a total area consistent with a total area of the first doped region 107 in the prior art.

Compared with the one in the prior art, the ESD protection device according to the first embodiment changes the arrangement manner of the first doped region with the total area of the first doped region 107 unchanged. Due to the changed arrangement manner of the first doped region, the area of the effective region 109 of the Zener diode (or avalanche diode) DZ is increased accordingly, which greatly improves the protection capability of the ESD protection device.

Figure 5A:
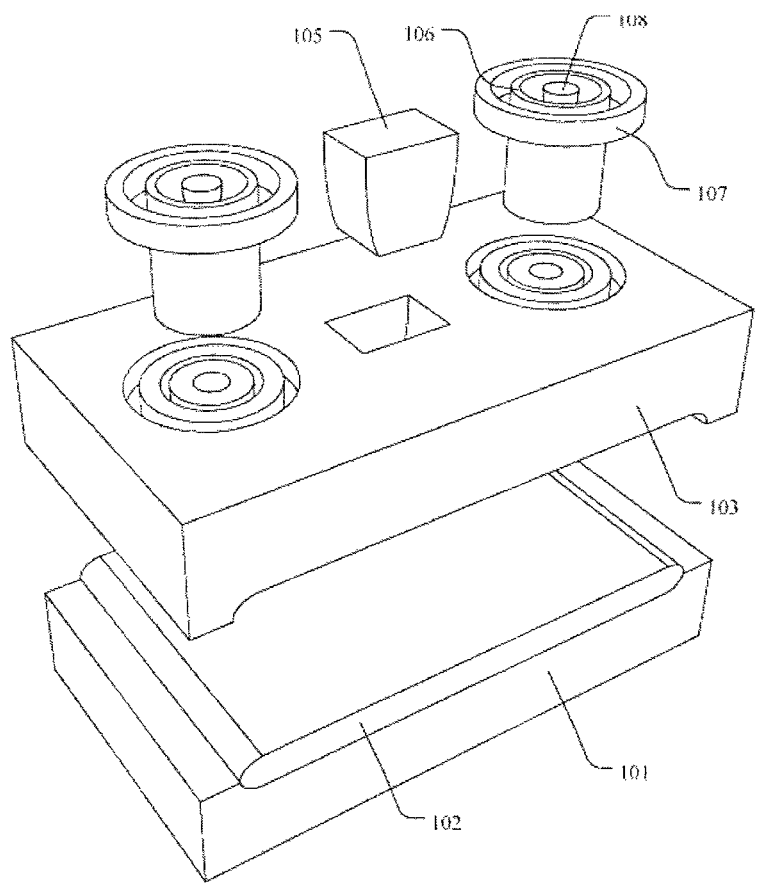
FIGS. 5a and 5b are a perspective decomposition diagram and a top diagram of an ESD protection device according to a second embodiment of the disclosure, respectively.
Figure 5B:
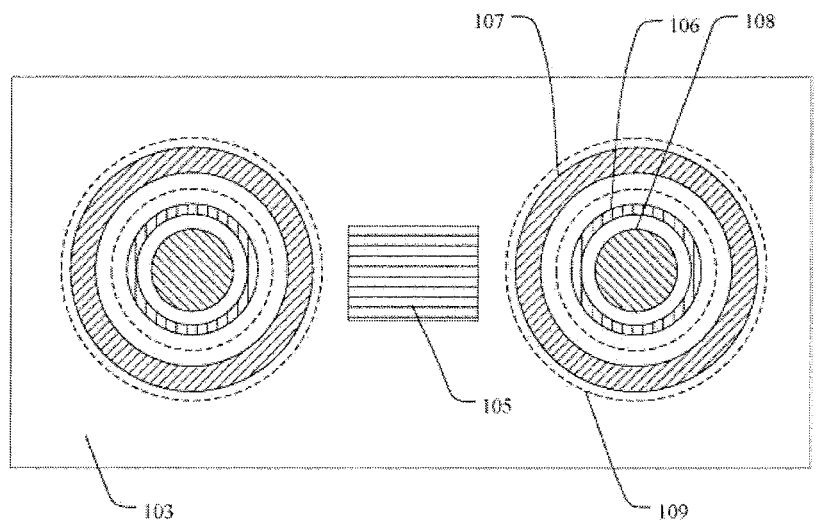

FIGS. 5a and 5b are a perspective decomposition diagram and a top diagram of an ESD protection device according to a second embodiment of the disclosure, respectively.

The difference between the ESD protection devices according to the second embodiment and the first embodiment is that, in the ESD protection device according to the second embodiment, the first doped region 107 in the epitaxial semiconductor layer 103 is an annular region, the annular region has an inner surface and outer surface which respectively form interfaces with the epitaxial semiconductor layer 103. In this embodiment, the annular region is a circular ring. The second doped region 108 is a columnar structure being formed in the epitaxial semiconductor layer 103 and the second doped region 108 is located inside the annular inner surface of the first doped region 107, and there is a gap between the outer surface of the second doped region 108 and the inner surface of the first doped region 107.

The interfaces are semiconductor interfaces, a semiconductor interface refers to a surface through which a semiconductor contacts with other substances including metal, insulating medium, and semiconductor. In the embodiment, the interfaces are referred to the surface between semiconductor and semiconductor.

Preferably, the ESD protection device according to the second embodiment, further includes an isolation region 106, the isolation region 106 is an annular region being located between the outer surface of the second doped region 108 and the inner surface of the first doped region 107. It should be noted that the annular region is a circular ring.

Other aspects of the ESD protection device according to the second embodiment are the same as those of the ESD protection device according to the first embodiment and they are not repeated here.

FIGS. 6a to 6d are cross sectional diagrams at different steps of the method for manufacturing the ESD protection device according to a third embodiment of the disclosure. The method is used to manufacture the ESD protection device according to the first embodiment.

Figure 6A:
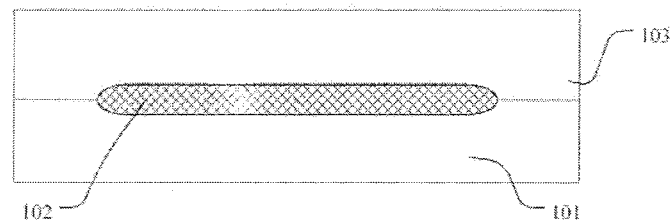
FIGS. 6a to 6d are cross sectional diagrams at different steps of the method for manufacturing an ESD protection device according to a third embodiment of the disclosure.

As shown in FIG. 6a, an N-type region is formed by doping and diffusing donor impurity at a specific position of a surface of the semiconductor substrate 101, and then the epitaxial semiconductor layer 103 is epitaxially grown by a known deposition process thereon, the deposition process is for example, one selected from the group consisting of electron beam evaporation (EBM), chemical vapor deposition (CVD), atomic layer deposition (ALD) and sputtering. The N-type region is covered by the epitaxial semiconductor layer 103 and buried below the surface, so that the N-type semiconductor buried layer 102 is formed inside the structure of the device The semiconductor substrate 101 is, for example, a single-crystal-silicon substrate and doped to be of P-type. The epitaxial semiconductor layer 103 is doped into N-type. A P-type semiconductor layer or region may be formed by implanting P-type dopant such as B in the semiconductor layer or region. An N-type semiconductor layer or region may be formed by implanting N-type dopant such as P or As in the semiconductor layer or region. By controlling implantation parameters, such as implantation energy and dosage, the doped region may reach a predetermined depth and may have a predetermined doping concentration.

Figure 6B:
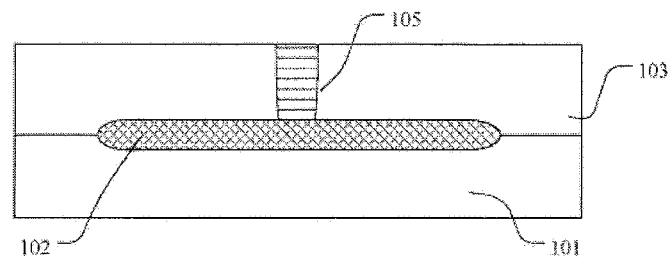

Further, as shown in FIG. 6b, the third doped region 105 is formed, the third doped region 105 penetrates through the epitaxial semiconductor layer 103 to the semiconductor buried layer 102, and the third doped region is for example, doped into N-type.

Figure 6C:
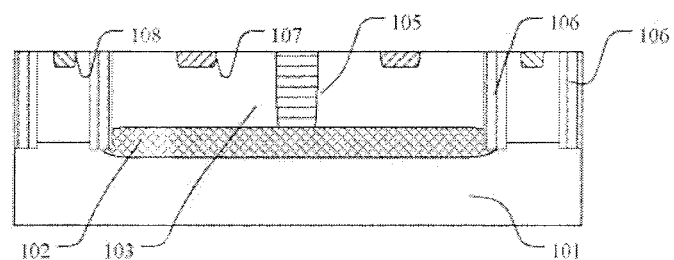

Further, as shown in FIG. 6c, the first doped region 107 and the second doped region 108 are formed in the epitaxial semiconductor layer 103, respectively. The first doped region 107 is of P-type, the first doped region 107 is centered on the third doped region 105, being disposed at both sides of the third doped region 105, and extends from the surface of the epitaxial semiconductor layer 103 into the epitaxial semiconductor layer 103 by a predetermined depth. The second doped region 108 is of N-type, the second doped region 108 is centered on the third doped region 105, being disposed at both sides of the third doped region 105 and being located at one side of the first doped region 107 far away from the third doped region 105, and extends from the surface of the epitaxial semiconductor layer 103 into the epitaxial semiconductor layer 103 by a predetermined depth.

In the embodiment, the first doped region 107 includes a plurality of sub-regions, the sub-regions are arranged in column, being formed symmetrically at both sides of the third doped region 105, and the sub-regions are rectangular.

Preferably, the method for manufacturing the ESD protection device according to the third embodiment further includes forming the isolation layer 106 between the first doped region 107 and the second doped region 108, the isolation layer 106 extends from the surface of the epitaxial semiconductor layer 103 to the semiconductor substrate 101, and the isolation layer 106 is further formed at the periphery of the ESD protection device, the isolation layer 106 extends from the surface of the epitaxial semiconductor layer 110 to the semiconductor substrate 101, and the isolation layer 106 isolates the ESD protection device from the adjacent semiconductor devices. The isolation layer 106 is for example a trench filled with insulating materials (for example, oxide) or a diffused isolation region with a doping type same with that of the first doped region 107.

Figure 6D:
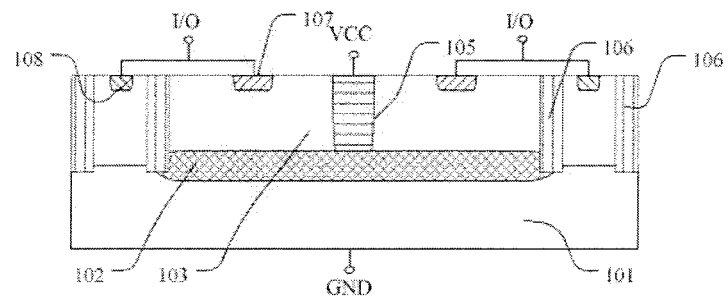

As shown in FIG. 6d, a first terminal is further formed, the first terminal is an input/output terminal I/O, the first doped region 107 and the second doped region 108 are coupled to each other to the input/output terminal I/O and the semiconductor substrate 101 is used as the ground GND.

Preferably, the method for manufacturing the ESD protection device according to the third embodiment, further includes forming a second terminal which is the power supply terminal VCC, and the third doped region 105 is coupled to the power supply terminal VCC.

It should also be understood that the relational terms such as "first", "second", and the like are used in the context merely for distinguishing one element or operation form the other element or operation, instead of meaning or implying any real relationship or order of these elements or operations. Moreover, the terms "comprise", "comprising" and the like are used to refer to comprise in nonexclusive sense, so that any process, approach, article or apparatus relevant to an element, if follows the terms, means that not only said element listed here, but also those elements not listed explicitly, or those elements inherently included by the process, approach, article or apparatus relevant to said element. If there is no explicit limitation, the wording "comprise a/an . . . " does not exclude the fact that other elements can also be included together with the process, approach, article or apparatus relevant to the element.

Although various embodiments of the present invention are described above, these embodiments neither present all details, nor imply that the present invention is limited to these embodiments. Obviously, many modifications and changes may be made in light of the teaching of the above embodiments. These embodiments are presented and some details are described herein only for explaining the principle of the invention and its actual use, so that one skilled person can practice the present invention and introduce some modifications in light of the invention. The invention is intended to cover alternatives, modifications and equivalents that may be included within the spirit and scope of the invention as defined by the appended claims.

The invention claimed is:

1. An ESD protection device, comprising:
   a semiconductor substrate;
   a semiconductor buried layer located in said semiconductor substrate;
   an epitaxial semiconductor layer located on said semiconductor substrate and comprising a first doped region and a second doped region,
   wherein said semiconductor substrate and said first doped region are of a first doping type, said semiconductor buried layer, said epitaxial semiconductor layer and said second doped region are of a second doping type, said first doping type and said second doping type are opposite to each other, and said first doped region forms a plurality of interfaces with said epitaxial semiconductor layer,
   wherein said ESD protection device further comprises a third doped region which penetrates through said epitaxial semiconductor layer to said semiconductor buried layer and said third doped region is of said second doping type, wherein said first doped region and said second doped region are connected to each other to a first terminal, and said third doped region is connected to a second terminal.

2. The ESD protection device according to claim 1, wherein said first doped region comprises a plurality of sub-regions which are respectively formed in said epitaxial semiconductor layer, and said plurality of sub-regions form said respective plurality of interfaces with said epitaxial semiconductor layer, respectively.

3. The ESD protection device according to claim 2, wherein said plurality of sub-regions are circular, square, or rectangular.

4. The ESD protection device according to claim 1, wherein said first doped region is an annular region being formed in said epitaxial semiconductor layer, and said annular region comprises an inner surface and an outer surface, said inner surface and said outer surface form said plurality of interfaces with said epitaxial semiconductor layer, respectively.

5. The ESD protection device according to claim 4, wherein said annular region is circular, square, or rectangular.

6. The ESD protection device according to claim 1, further comprising: an isolation layer being formed between said first doped region and said second doped region in said epitaxial semiconductor layer.

\* \* \* \* \*